United States Patent [19]
Norling

[11] 3,934,240
[45] Jan. 20, 1976

[54] TIMER FOR TELEPHONE TOLL CALLS AND THE LIKE

[76] Inventor: Marshall F. Norling, 9195 E. Oxford Drive, Denver, Colo. 80201

[22] Filed: Sept. 28, 1973

[21] Appl. No.: 401,907

Related U.S. Application Data

[63] Continuation of Ser. No. 231,554, March 3, 1972, abandoned.

[52] U.S. Cl............................ 340/309.4; 340/309.1
[51] Int. Cl.² ........................................... G08B 5/36
[58] Field of Search ......... 340/309.1, 309.4, 43, 44, 340/309.5; 179/7.1, 7 A, 2 TC, 6 TA

[56] References Cited
UNITED STATES PATENTS

| | | |
|---|---|---|
| 2,906,333 | 9/1959 | Ritzenthaler.................... 340/309.4 |
| 3,592,118 | 7/1971 | Buechner........................ 340/309.4 |
| 3,686,633 | 8/1972 | Carmody..................... 340/168 CC |

*Primary Examiner*—Harold I. Pitts

[57] ABSTRACT

A toll call time indicator comprises a small case or housing suitable for location adjacent a telephone and which has three readily visible different colored lights or other indicators for advising the user of the passage of time. A switch on the casing, when actuated, starts the timer and actuates the first signal, at the end of a predetermined period a second signal is actuated to indicate passage of a major portion of the full time interval and the third signal is actuated at or near the end of the period. The lights or indicators are arranged to be readily visible at a distance and are useful for supervisory purposes.

4 Claims, 2 Drawing Figures

TIMER FOR TELEPHONE TOLL CALLS AND THE LIKE

REFERENCE TO RELATED APPLICATION

This is a continuation of application Ser. No. 231,554 filed Mar. 3, 1972, now abandoned.

This invention relates to timers for relatively short periods of time and particularly to an improved timer for telephone toll calls and the like.

BACKGROUND OF THE INVENTION

Various types of timers have been provided heretofore to measure or indicate short periods of time such as the three minute period for telephone toll calls. These devices have included invertible short time timers of the hourglass type, timers with gravity actuated escapements, clockwise timers, and other spring operated devices. These devices have provided various forms of indicators and include audible alarms to indicate the passage of time. It is desirable to produce a timer device to apprise the user of the telephone of the passage of a major portion of the time and which will indicate the approach of the end of the time period for the call. It is also desirable to provide a timing device which may be observed at a distance and enable a supervisor of a group of telephone users to determine the effectiveness of the users in maintaining their calls within a predetermined time period. Accordingly, it is an object of the invention to provide a timer for telephone toll calls and the like including an improved arrangement for readily and reliably apprising the user of the passage of time.

It is another object of this invention to provide a timer for telephone toll calls and the like including indicators of the initiation of the use of the timer, of the passage of a predetermined measured portion of the time and of the approach of the full time period, and further which may readily be observed at a distance for monitoring the use of the telephone.

SUMMARY OF THE INVENTION

Briefly in carrying out the objects of this invention in one embodiment thereof, the timer is provided in a small case readily located on a desk adjacent a telephone and which is operated by the simple actuation of a switch. A timer within the case is arranged to actuate readily visible indicators, specifically electric lamps, to advise the user of the passage of a predetermined time after actuation of the timer and of the approach of the final period. The lights employed are provided with suitable lenses which are readily visible at a distance from the telephone and which are three in number each of a different color. The timer includes a suitable timing device which in the preferred form is a solid state electronic timer arranged to actuate the three signal lights in order. The timer is silent in operation and produces no sound audible over the telephone.

The features of novelty which characterize this invention are pointed out with particularity in the claims annexed to and forming a part of this specification. The invention itself, however, both as to its organization and method of operation together with further objects and advantages thereof will best be understood upon reference to the following description taken in connection with the accompanying drawing in which:

DETAILED DESCRIPTION

Figure 1:
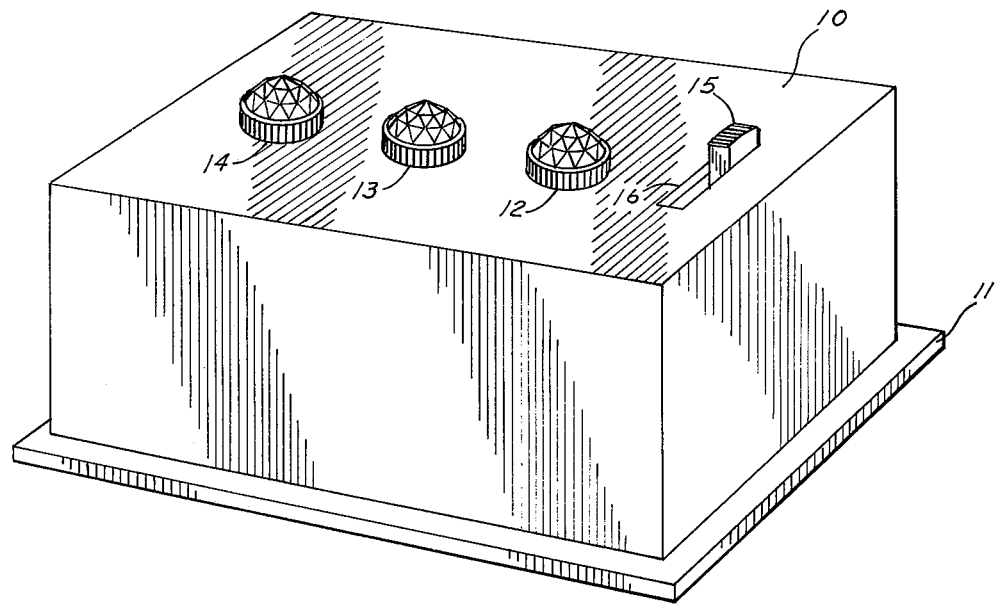
FIG. 1 is a perspective view of a timer embodying the invention.

Referring now to the drawing, the timer illustrated in FIG. 1 comprises a casing 10 mounted on a base 11 and having three signal light buttons or lenses 12, 13 and 14 arranged in a line centrally of its top surface and a switch actuator 15 in alignment with the lenses and positioned for movement in a slot 16 to move the switch between its "on" and "off" positions. The casing 10 is of a generally rectangular box-like configuration and has arranged within a timing mechanism which is started by actuation of the switch 15 and immediately energizes the light for the lens 12 which may be gree indicating the beginning of the timing cycle. At the end of say 2 minutes, the light for lens 12 is turned off and the light for the lens 13 which may be an amber light is energized. Toward the end of a 3 minute period, the light for the lens 14, preferably red, is energized and the light for lens 13 de-energized, thus indicating the end of the three minute toll call.

The buttons or lenses 12, 13 and 14 are preferably lenses which accentuate the lighting effect and readily may be seen in daylight so that the energization of the respective lamps can be observed not only by the user of a telephone but by a person remote from the telephone. Thus, in a room where a large number of telephone users are working, a supervisor may observe the manner in which the telephones are used and note telephones which are used in excess of the 3 minute period.

The timing mechanism employed to energize the lamps below lenses 12, 13 and 14 may be of any type suitable for measuring the required elapsed time periods and preferably is a timer of the sloid state electronic type. A timer of this type has the advantage that it creates no sound which might be disturbing when heard over the telephone. Furthermore, the solid state timer does not require the application of any force to effect its operation and is accurate and reliable for timing purposes. While the switch 15 has been indicated as of the two position type, any other switch suitable to start operation of the timer may be employed. For example, the simple key type push button switch may be used which is arranged to be closed upon a first depression of a button and to be opened upon the second operation. Thus, the timer may be started by a simple push button and may be stopped in the same manner.

Figure 2:
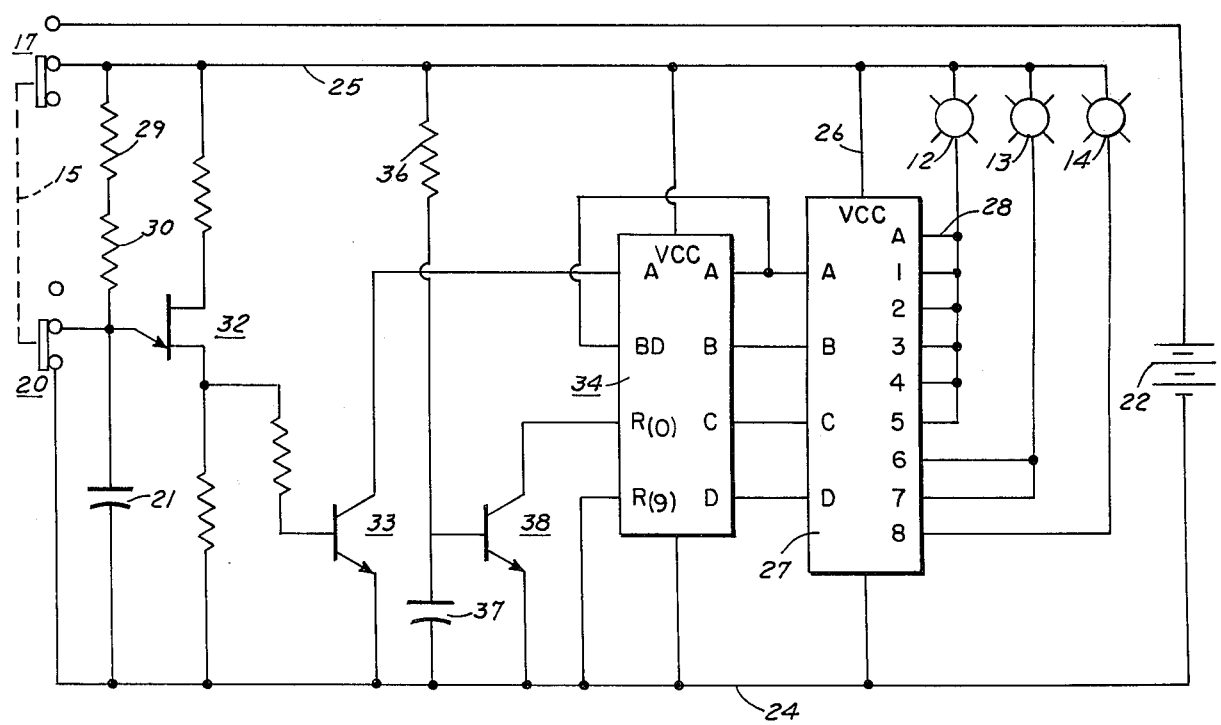
FIG. 2 is a schematic circuit diagram illustrating a solid state circuit suitable for operation of the timer of FIG. 1.

In FIG. 2 there is illustrated a solid state timer suitable for incorporation in the casing of the timer in FIG. 1. As illustrated in FIG. 2, the switch actuator 15 is arranged to actuate two single throw double pole switches 17 and 20. In the "off" position as illustrated, the switch 20 connects its two lower contacts, the third contact being unused and the switch 17 rests on its middle contact and its lower unused contact. In this position of the switch, the switch 20 short circuits a capacitor 21 and the switch 17 opens the circuit from a battery 22 which has its negative terminal connected to a common line or conductor 24. The lamps for the lenses 12, 13 and 14 are indicated as 12', 13' and 14', respectively. When the switch actuator 15 is moved upwardly it connects the positive terminal of the battery 22 to a line 25 and energizes the lamp 12' for the lens 12 through a connection 26, a decoder driver 27 in an upward line 28 from the driver. At the same time the switch 20 is moved out of shorting position and the capacitor 21 is charged through resistors 29 and 30. The capacitor 21 and the resistances 29 and 30 provide a timing circuit, and, when the capacitor has reached a predetermined potential, a unijunction transistor 32 becomes conducting and a transistor 33 connected to the lower terminal of the unijunction transistor 32 is gated to produce a timing pulse which is impressed on the top left hand terminal of a BCD decade counter. The resistances 29 and 30 and capacitor 21 together with the unijunction transistor 32 thus provide clock pulses which may, for example, occur at intervals of 20 seconds. Transistor 33 shapes the clock pulse to impress an essentially square wave on a decade counter to drive the counter. The binary coded decade counter upon receiving each input pulse at its upper left-hand terminal changes the state of the four right-hand terminals to represent the number of input pulses which have been counted in the binary code. The decoder driver 27 has nine output terminals of which only one is at logic zero for any given count from zero through nine. Whenever one of the lamps 12', 13' or 14' is connected to a terminal having a logic zero output, the lamp is energized. Thus, as the count changes the green lamp will remain energized in the arrangement illustrated for the first five counts. On the sixth count, the green light is de-energized and the amber light 13' energized, this light remaining energized during the seventh count and being de-energized and the light 14' energized on the eighth count. The time for sequencing all three lamps is approximately 3 minutes.

In order to provide a reset signal for the decade counter 34, a timing circuit is provided comprising a resistor 36 and a capacitor 37 connected to trigger a transistor 38. When the reset signal is applied to the input terminal R(O) of the counter 34 on the triggered or conducting condition of the transistor 38 a logic zero is provided at the R(O) input to enable or reset the counter.

This solid state circuit may be provided on a printed circuit board in accordance with present day practice, the lamps 12', 13' and 14' also being mounted on the board to lie below and adjacent the apertures covered by their respective lenses when the cover containing the lenses is secured in position over the circuit board. The battery 22 may, for example, comprise two size D flashlight batteries, which may easily be mounted within the housing 10.

It is therefore readily apparent that the present invention provides as an article of manufacture, a portable, self-contained, readily monitorable timing unit for timing telephone calls and the like. The unit comprises wall means including a top wall defining a closed housing of a size readily usable on a supporting surface such as a desk or the like and adjacent a telephone instrument. Within the housing and beneath the top wall thereof are first, second and third light emitting signal elements arranged in a row for respectively indicating, and in order, the beginning of a predetermined time period, the passage of an intermediate time period and the termination of the predetermined time period. The housing also has therewithin an electric battery means and timing means. The timing means includes solid state timing circuitry connected between said battery means and the signal elements which utilizes the battery means as its energy source for actuating the light emitting signal elements in order. Switching means are provided for initiating operation of the timing means. The switching means includes a starting element mounted on the housing and accessible from the outside thereof and which starting element upon actuation connects the timing means to the battery for energization whereby said timing means actuates said first, second and third light emitting signal elements in order.

Specifically, in the invention the solid state circuitry includes timing components and a switch means is provided for controlling the circuitry. The switch means includes an operating member disposed in an opening in the top wall of the housing along side the signal elements. This operating member is manipulable in its opening from exteriorily of the housing between a first position electrically connecting said timing components between the battery and the signal elements and a second position electrically disconnecting said battery from said timing components. The timing components being effective in the first position of the switching means operating member to energize said first, second and third light emitting signal elements in a sequential relationship such that said first element is initially energized to indicate the beginning of the predetermined time period, upon the passage of the intermediate time period the second element is energized and the first element deenergized, and upon the passage of the predetermined time period the third element is energized and the second element is deenergized.

The top wall of the housing has a row of openings therein overlying the signal elements and different colored lenses are arranged over the openings and protrude above the top wall of the housing so as to facilitate ready viewing of the timing of a telephone toll call being carried by a telephone instrument by a monitor positioned at a distance from such instrument.

I claim:

1. As an article of manufacture, a self-contained timer unit for timing telephone toll calls and the like comprising a closed housing of a size readily usable on a desk or the like adjacent a telephone instrument, said article comprising:

first, second and third light emitting signal elements on said timer for indicating respectively and in order the beginning of a predetermined time period and the passage of an intermediate time period and the termination of said predetermined time period;

an electric battery mounted within said housing, timing means including solid state timing circuitry within said housing and utilizing said battery as its energy source for actuating said light emitting signal elements in order; and switching means for initiating operation of said timing means, said switching means including a starting element mounted on said housing and accessible from the outside thereof, and said starting element upon actuation connecting said timing means to said battery for energization first circuit connecting means in said timing means operative to energize said first signal element only immediately upon actuation of said switching means, second circuit connecting means in said timing means operative after the passage of said intermediate time period simultaneously to deenergize said first signal element and to energize said second signal element only, and third circuit connecting means in said timing means operative after the passage of said predetermined time period simultaneously to deenergize said second signal element and to energize said third signal element only.

2. A self-contained timer unit as claimed in claim 1 and said housing including a top wall, said light emitting signal elements being of different colors and arranged in a row relative to said top wall so as to be visible from a remote point, and said switching means starting element also being operatively related with said top wall.

3. A portable, self-contained, readily monitorable timer unit for timing telephone calls and the like comprising wall means including a top wall defining a closed housing of a size readily usable on a supporting surface adjacent a telephone instrument, within said housing and beneath said top wall first, second and third light emitting signal element means arranged in a row for respectively indicating and in order, the beginning of a predetermined time period, the passage of an intermediate time period and the termination of said predetermined time period, an electric battery within said housing, timing means within said housing for actuating said signal element means, said timing means comprising solid state circuitry connected between said battery and said elements, and including timing components and a switch means for controlling said circuitry, said switch means being operable exteriorly of said housing between a first position electrically connecting said timing components between said battery and said signal element means, and a second position electrically disconnecting said battery from said timing components, said timing components being effective in said first position of said switch means to energize said first, second and third light emitting signal element means in such a sequential relationship that said first signal element means only is immediately initially energized, upon the passage of said intermediate time period only said second signal element means simultaneously being energized and said first element means being deenergized, and upon the passage of said predetermined time period only said third signal element means simultaneously being energized and said second element being deenergized, said top wall having a row of openings therein overlying said signal element means, and said signal element means including different colored lenses arranged in said openings and protruding above said top wall so as to facilitate ready viewing of the timing of a telephone toll call being carried by such a telephone instrument by a monitor positioned at a distance from such instrument.

4. As an article of manufacture, a self-contained timer unit for timing telephone toll calls and the like comprising a closed housing of a size readily usable on a desk or the like adjacent a telephone instrument, said article comprising:

first, second and third light emitting signal elements on said timer for indicating respectively and in order the beginning of a predetermined time period and the passage of an intermediate time period and the termination of said predetermined time period;

an electric battery mounted within said housing, timing means including solid state timing circuitry within said housing and utilizing said battery as its energy source for actuating said light emitting signal elements in order; and, switching means for initiating operation of said timing means, said switching means including a starting element mounted on said housing and accessible from the outside thereof, and said starting element upon actuation connecting said timing means to said battery for energization, first circuit connecting means in said timing means operative to energize said first signal element only immediately upon actuation of said switching means, second circuit connecting means in said timing means operative after the passage of said intermediate time period simultaneously to de-energize said first signal element and to energize said second signal element only, and third circuit connecting means in said timing means operative after the passage of said predetermined time period simultaneously to de-energize said second signal element and to energize said third signal element only, said timing means including a source of substantially equally timed pulses feeding a binary coded decade counter having a decoder driver operatively connected thereto, said decoder having nine output terminals of which only one is at operative logic zero for any given count from zero through nine, and wherein the said zero through five output terminals of said driver are included within said first circuit connecting means, the sixth and seventh output terminals are included within said second circuit connecting means and the eighth output terminal is included within said third circuit connecting means.

* * * * *